United States Patent [19]
Bhullar

[11] Patent Number: 5,991,226
[45] Date of Patent: Nov. 23, 1999

[54] ADDRESS COUNTER CELL

[75] Inventor: Gurpreet Bhullar, Nepean, Canada

[73] Assignee: Mosaid Technologies Incorporated, Kanata, Canada

[21] Appl. No.: 08/995,991

[22] Filed: Dec. 22, 1997

[30] Foreign Application Priority Data

Nov. 28, 1997 [CA] Canada .................................. 2223119

[51] Int. Cl.⁶ ...................................................... G11C 8/00
[52] U.S. Cl. ................................ 365/230.08; 365/189.05; 365/233; 365/233.5
[58] Field of Search ............................... 365/236, 189.05, 365/230.08, 233, 233.5; 327/202, 208

[56] References Cited

U.S. PATENT DOCUMENTS

| | | | |
|---|---|---|---|
| 5,161,120 | 11/1992 | Kajimoto et al. .................. | 365/189.05 |
| 5,285,421 | 2/1994 | Young et al. ....................... | 365/230.04 |
| 5,521,878 | 5/1996 | Ohtani et al. ........................... | 365/233 |
| 5,586,081 | 12/1996 | Mills et al. ......................... | 365/230.08 |
| 5,657,481 | 8/1997 | Farmwald et al. ..................... | 395/551 |
| 5,675,549 | 10/1997 | Ong et al. ........................... | 365/233.5 |
| 5,684,752 | 11/1997 | Mills et al. ........................ | 365/230.03 |
| 5,708,622 | 1/1998 | Ohtani et al. ........................... | 365/233 |
| 5,896,341 | 4/1999 | Takahashi .......................... | 365/230.06 |

*Primary Examiner*—David Nelms
*Assistant Examiner*—Hien Nguyen
*Attorney, Agent, or Firm*—Pascal & Associates

[57] ABSTRACT

An address counter cell for use in burst mode operation in a synchronous DRAM is described which, in response to a falling edge of a system clock, simultaneously loads address inputs into an external address master latch and an internal address master latch, and further enables a multiplexer to select between the external and internal address inputs. In response to a subsequent rising edge of the system clock, the selected address input is then loaded into a low-output-load capacitance slave latch and is further provided to complementary output nodes. The signal from one of the output nodes is also fedback to circuitry for incrementing the selected address internally for subsequent clock cycles remaining in the burst mode operation. Once the initial address of the burst operation has thusly been entered, for the remainder of the burst mode, the multiplexer selects the address loaded into the internal address master latch and operates as an edge-triggered flip/flop with the master latch accepting an incremented address in response to the falling edge of the system clock and with the slave latch loading and outputting the incremented address in response to the rising edge of the system clock. During a standby mode, circuitry is provided for disabling the counter cell and ensuring that the output nodes are stable and disabled.

18 Claims, 1 Drawing Sheet

ADDRESS COUNTER CELL

FIELD OF THE INVENTION

This invention relates to a counter that can be used in a column addressing circuit of a random access memory (RAM).

BACKGROUND TO THE INVENTION

As demand increases for higher density and speed in dynamic random access memories, various approaches have been used to increase the speed of data access. Conventional DRAMs are currently operating in extended data output mode (EDO) in which data lines are not tri-stated between read cycles. Instead, data is held valid after /CAS, or until /RAS is brought high. Complex timing is required to properly time the arrival of valid data at output pins from the input of column addresses.

In synchronous DRAMs (SDRAMs), a system clock is used to synchronize a burst mode operation which essentially consists of inputting an initial start address and then incrementing the subsequent column addresses internally, in response to the system clock cycles. SDRAMs however, require several additional pins compared to conventional DRAMs and as such, are more difficult to fit in within standard memory modules SIMMs. Furthermore, the synchronization of all signals with the system clock requires an additional level of design complexity not required in conventional DRAMs.

U.S. Pat. No. 5,675,549 issued to Ong et al on Oct. 7, 1997 describes a burst EDO memory address counter which consists of two flip/flops and a multiplexer and which can be implemented in EDO DRAM having a standard pin-out compatible with SIMM memory modules. The counter structure provides for linear or interleaved addressing sequences. The counter cell implementation is in fact a 2 bit burst address counter which simply counts the number of addresses required in the burst operation. The multiplexer is used to provide the toggle condition for the next counter bit.

In SRAMs employing burst mode operation, the internal counter used to generate column addresses must be loadable with both external and internal addresses. Typical implementations receiving internal and external address select input signals suffer from a high setup time requirement between these address select signals and the system clock. As a result, the system clock must be delayed significantly to meet the set up time requirements. To reduce this setup time, gated clocks may be employed which reduce the setup time, but carry inherent dangers of flitches which can result by latching spurious column addresses.

A need therefore arises for a counter cell which has minimal setup time, fast propagation delay and ensures robustness of the latched column address.

SUMMARY OF THE INVENTION

Since the column address counter lies in a critical path for column operation in SDRAMs, it is important that column address count cells should have low setup time and fast propagation delays. The present invention is a structure of a column address counter which provides low setup time, and at the same time minimizes the propagation delays.

In accordance with an embodiment of the present invention, an address counter cell for use in an address counter is comprised of an external-address master latch; an internal-address master latch; a multiplexer for selecting an external address stored in the external-address latch in response to an external-address control signal, and for selecting an internal address stored in the internal-address latch in response to an internal-address control signal; a slave latch for storing the selected address from the multiplexer and for providing the selected address to an output; and address incrementing circuitry for incrementing the selected address and providing an incremented address as an input to the internal-address master latch.

In accordance with another embodiment, a method of generating an address to an output is comprised of receiving a system clock pulse leading edge and, in response: loading an external and an internal address input into a first and second master latches respectively; selecting an address from the first and second master latches; providing the selected address to an input of a slave latch; and receiving a subsequent system clock trailing edge and, in response: loading the selected address into the slave latch; providing the selected address to the output; providing the selected address to circuitry for internally incrementing the address and providing the incremented address as an input to one of the master latches.

In accordance with another embodiment, an apparatus for generating an address bit is comprised of an external-address master latch; an internal-address master latch; an address selection circuit for selecting an external address stored in the external-address latch in response to an external-address control signal, and for selecting an internal address stored in the internal-address latch in response to an internal-address control signal; a slave latch for storing the selecting address from the address selection circuit and for providing the selected address to an output; feedback circuitry for providing a fed back version of the output signal; address incrementing circuitry, including a carry input from a previous stage, for incrementing the fed back selected address and providing an incremented address as an input to the internal-address master latch; and a system clock signal for synchronizing the operation of the master and slave latches.

In accordance with another embodiment, a counter cell circuit for generating an address signal at an output is comprised of a pair of master latches each for storing an address signal, a counter cell output for receiving at least one of the address signals, an intermediate storage and transfer stage having an output coupled to the counter cell output, a multiplexer having control inputs for receiving control signals, and having signal inputs coupled to outputs of corresponding master latches and having an output coupled to an input of the intermediate stage, a circuit for applying an external address signal to one of the master latches, during an external address input mode of operation; a feedback loop for applying a signal appearing at the counter output to the other of the master latches, via incrementing circuitry, during an internal address burst mode of operation, and a system clock for synchronizing the loading of the master latches and the storage and transfer stage, whereby the counter cell output is generated directly from the external address or internally by incrementing a previous output in response to the system clock.

In accordance with another embodiment, a latch is comprised of a pair of PMOS FETs having their source-drain circuits connected in series between a voltage source VDD and serially connected source-drain circuits of a pair of NMOS FETs which are connected between the PMOS FETs and ground, a gate of a first of the PMOS FETs, which is connected to the voltage source VDD, being coupled to ground, a gate of a first of the NMOS FETs, which is connected to ground, being coupled to the voltage source VDD, an input to the latch being coupled to a junction of the other PMOS FET and the other NMOS FET, and to an input of an inverter, an output of the inverter being coupled to gates of the other PMOS FET and of the other NMOS FET, the output of the inverter providing an output to the latch, and gate lengths of the first PMOS FET and the first NMOS FET being substantially larger than gate lengths of the other PMOS and NMOS FETs.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
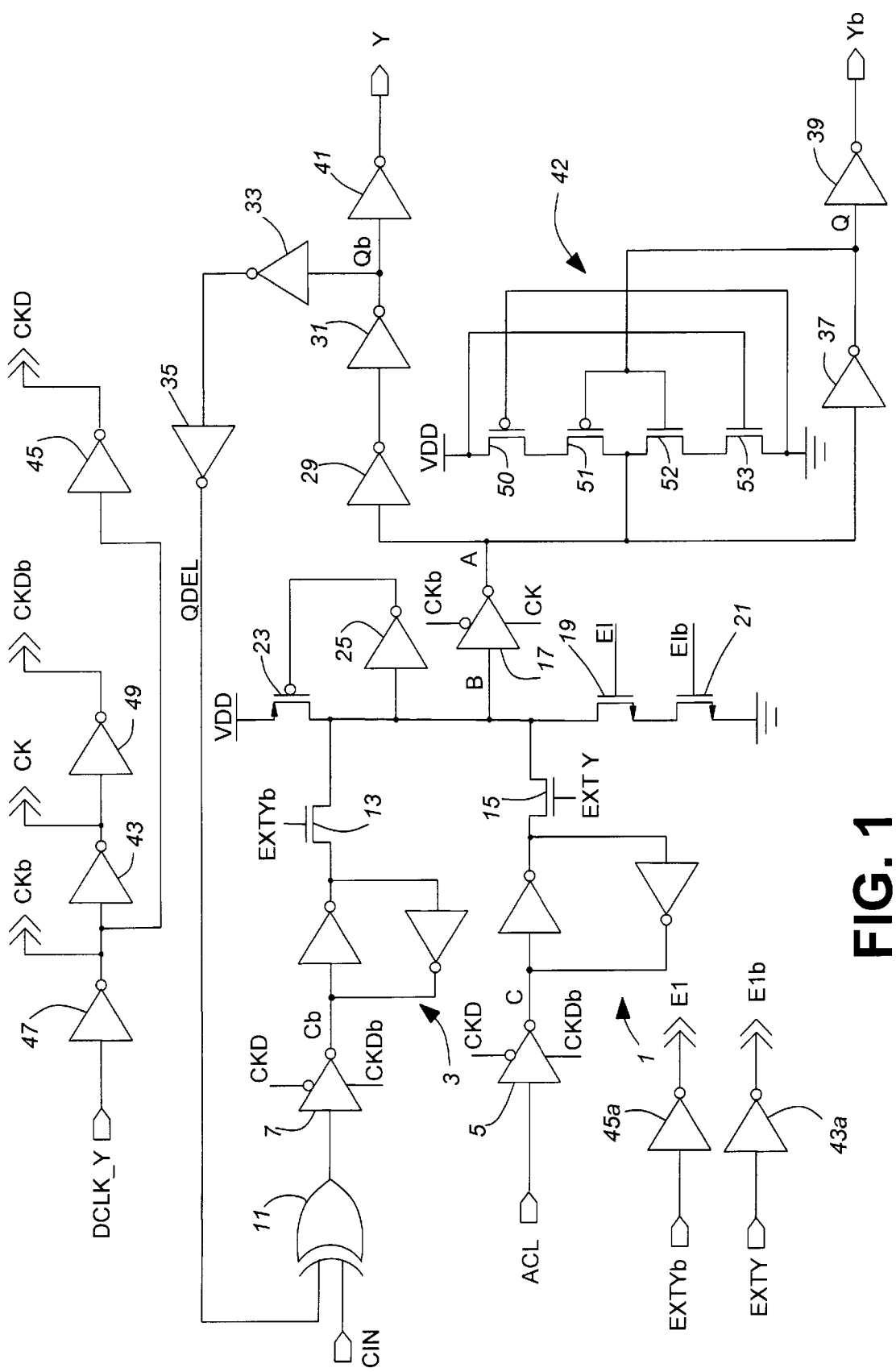
FIG. 1 is a schematic diagram of a preferred embodiment of the invention.

A column address counter cell that can be used to generate successive addresses in an SDRAM is illustrated in FIG. 1. The circuit is comprised of a pair of input or master latches 1 and 3. A base address signal ACL is received at an input correspondingly labeled, which signal is transferred for storage in the latch 1 via an inverter 5, the output of which is coupled to the input of latch 1. A corresponding inverter 7 has its output coupled to the input of latch 3. The input of inverter 7 is coupled to the output of exclusive OR gate 11, which has an input from previous counter stage CIN, applied to one input via a correspondingly labeled input.

A pair of FETs 13 and 15, in this embodiment being of n-channel polarity, have their source-drain circuits respectively connected in series between the output of a corresponding latch, and the input of a transfer element, shown as inverter 17.

A pair of n-channel FETs 19 and 21 have their source-drain circuits connected in series between the input of inverter 17 and ground. A p-channel FET 23 has its source-drain circuit connected in series between a voltage source VDD and the input of the inverter 17. An inverter 25 is connected between the input of inverter 17 and the gate of FET 23.

The output of inverter 17 is coupled via a pair of inverters 29 and 31 connected in series, and a subsequent pair of inverters 33 and 35 connected in series, to another input of exclusive OR gate 11.

The output of inverter 17 is also coupled via inverters 37 and 39 to an output Yb, and the output of inverter 31 is connected via inverter 41 to an output Y. An output of slave latch 42 is coupled to the output of inverter 17 and the input of inverter 37.

A clock signal DCLK_Y is applied from a correspondingly labeled input to the inputs of inverters 43 and 45 via inverter 47. An inverter 49 is coupled to the output of inverter 43. A signal CKb is provided from the output of inverter 47, a signal CK is provided from the output of inverter 43, a signal CKDb is provided from the output of inverter 49, and a signal CKD is provided from the output of inverter 45. Thus signals CKb and CK are the buffered complementary versions of signal DCLK_Y, and the signals CKDb and CKD are delayed complementary version signals of signal DCLK_Y.

The inverters 5 and 7 are controlled inverters which are enabled by the signal CKD going low to their PMOS controlling inputs and by CKDb going high to their NMOS controlling inputs, thus powering the inverters. Inverter 17 is enabled by the signal CKb going low to its PMOS controlling input and by the signal CK going high to its NMOS controlling input.

A pair of control signals EXTY and EXTYb, designating external or internal address counter mode, (which are typically complementary) are received via correspondingly labeled inputs, and are inverted by respective corresponding inverters 43a and 45a, to provide the signals E1b and E1. The signals EXTY and EXTYb are applied to the respective gates of FETs 15 and 13. The signals E1 and E1b are applied to the respective gates of FETs 19 and 21.

In burst mode operation, a start address ACL is loaded into master latch 1 through inverter 5 which is enabled by CKD being high and CKDb being low. The signal EXTY is made high to select an external address while EXTYb is made low. These signals are derived from the column cycle control circuitry and select between external and internal address inputs to the column address counter cell. As a result, FET 15 is turned on and FET 13 is turned off, resulting in the acceptance of the external start address. Since FET 15 is turned on, it passes the latched external address ACL to the input of inverter 17. On the next rising edge of the clock DCLK_Y, the controlling signals for inverter 17, CK and Ckb, become high and low respectively, thereby enabling inverter 17 and loading the address into the slave latch 42. Shortly thereafter, the controlling signals of inverter 5, CKD and CKDb become high and low respectively, thereby disabling inverter 5 and isolating the master latch 1 from any other input. Once inverter 17 has been enabled, the slave latch 42 latches the address and provides the complementary outputs Y and Yb through inverters 29, 31 and 41, for Y, and inverters 37 and 39, for Tb.

The output of inverter 31 is also fedback to the input of the EXOR gate 11 through inverters 33 and 35. The fedback address is combined in the EXOR gate 11 with the carry bit from a previous stage. The carry bit is generated through combinational logic as is well known in the art. The output of the EXOR gate 11 then waits for the next falling clock edge to load the resulting signal into master latch 3. With the start address latched output as the Y and Yb signals, the counter cell is then ready to begin incrementing the address outputs according to the burst mode.

During the remaining clock cycles of the burst mode, the address counter begins incrementing the column address. On the falling edge of DCLK_Y, inverter 7 is enabled, and an internal address, incremented by the EXOR gate 11, is loaded into master latch 3. EXTYb is then made high while EXTY is made low, allowing the passing of the internally incremented address to the input of inverter 17. On the following rising edge of CLK_Y, inverter 17 is enabled, and the incremented address is loaded into the slave latch 42. The outputs of the cell are then once again provided as signals Y and Yb as well as fedback to the EXOR gate 11 for the next clock cycle, to repeat the operation for the remainder of the burst mode. The counter cell as shown in FIG. 1, therefore acts as an edge triggered flip-flop for the remaining cycles of the burst mode operation.

In one embodiment of the present invention, FETs 13 and 15 are NMOS devices. NMOS devices are used in place of CMOS transfer gates to avoid additional parasitic capacitance that may be introduced by the PMOS devices. However, NMOS pass transistors experience a voltage threshold drop across their source/drain paths when a logic high is to be passed through them. To address this problem, FET 23 and inverter 25 are provided to ensure that if a logic high is to be passed to the input of inverter 17 and therefore inverter 25 as well, that logic high will be reinforced and latched high through the half latch formed by inverter 25 and FET 23. Alternately, full CMOS pass gates could be employed in place of PETs 13 and 15, eliminating the need for FET 23 and inverter 25 at the cost of increased load capacitance and propagation delays.

FETs 19 and 21 are further provided to avoid causing a floating node to exist at the input to inverter 17. If the address counter is disabled, both EXTY and EXTYb are set low. As a result, both E1 and E1b are high, pulling the input to inverter 17 low and ensuring that both outputs Y and Yb are held low.

The structure of the slave latch 42 is another feature of the present invention. Instead of simply connecting two common inverters back to back, as is shown for the master latches 1 and 3, the slave latch consists of one common inverter 37 and a special inverter made up of PMOS FETs 50, 51 and NMOS FETs 52, 53 all having their source-drain circuits connected in series between VDD and ground. The gates of FETs 50 and 53 are coupled to ground and VDD respectively and the gate lengths of FETs 50 and 53 are made substantially larger than those of FETs 51, 52. The result is an inverter with a reduced output load capacitance and fast switching characteristics which furthermore, will not fight with the output node of inverter 17, due to the weak devices 51, 52. This configuration ensures fast reliable switching within the counter cell.

It should be noted that the delay from the time of the rising edge of control signal(s) EXTY/EXTYb to the time of the transfer of the desired data from a master latch to the input of the inverter 17, is made less than or equal to the delay from the edge of DCLK_Y to the edge of CKb. This ensures that the input to the inverter 17 is stable prior to it being enabled by CK and CKb under zero setup time conditions.

Under small negative setup times, the inverter 17 is enabled prior to the availability of stable data at its input. However, due to the propagation delay through inverter 17 and succeeding stages, there exists a small window of time after CKb is enabled during which its input can stabilize to the expected value.

While a particular clocking scheme has been described, a different clocking scheme can be used. For example, the clock can be buffered internally of the circuit to reduce loading and slightly improve setup time for data.

It is also possible to directly drive the enable inputs of tri-stateable inverters from a non-buffered clock.

Instead of the pass FETs described, full CMOS transmission gates could be used. Tri-stateable inverters can be used for the latches with enable signals controlled by the clock.

While the design has been described above as being implemented for column address counters, it can be used for other purposes which uses a multiplexer and a flip-flop. Thus the design, excluding the feedback loop and the exclusive OR gate, can be used to implement parallel load shift registers, and word parallel loadable counters. Some of such applications may have no need to latch the output of the inverter 17, and in such cases the latch 42 and associated inverters can be deleted.

A person understanding this invention may now conceive of alternate embodiments and enhancements using the principles described herein. All such embodiments and enhancements are considered to be within the spirit and scope of this invention as defined in the claims appended hereto.

I claim:

1. An address counter cell for use in an address counter comprising:

(a) an external-address master latch;
(b) an internal-address master latch;
(c) a multiplexer for selecting an external address stored in the external-address latch in response to an external-address control signal, and for selecting an internal address stored in the internal-address latch in response to an internal-address control signal;
(d) a slave latch for storing the selected address from the multiplexer and for providing the selected address to an output; and
(e) address incrementing circuitry for incrementing the selected address and providing an incremented address as an input to the internal-address master latch.

2. An address counter cell as defined in claim 1 including circuitry for receiving a system clock signal and providing buffered versions of the system clock signal to control the master and slave latches.

3. An address counter cell as defined in claim 2 wherein address inputs are loaded into the external and internal-address latches in response to a leading edge of the system clock and the selected address from the multiplexer is loaded into the slave latch in response to a subsequent trailing edge of the system clock.

4. An address counter as defined in claim 3 in which the leading edge is a falling edge and the trailing edge is a subsequent rising edge of the system clock signal.

5. An address counter as defined in claim 4 including a circuit for feeding the address from the output back to the internal-address master latch and for loading the fed back address into the internal-address master latch in response to subsequent falling edges of the system clock signal, and a circuit for loading the selected addresses from the multiplexer into the slave latch during rising edges of the system clock signal following each of said subsequent falling edges of the system clock signal.

6. A method of generating an address to an output comprising:

(a) receiving a system clock pulse leading edge and, in response:
   I. loading an external and an internal address input into a first and second master latches respectively;
   II. selecting an address from the first and second master latches;
   III. providing the selected address to an input of a slave latch;
(b) receiving a subsequent system clock trailing edge and, in response:
   I. loading the selected address into the slave latch;
   II. providing the selected address to the output;
   III. providing the selected address to circuitry for internally incrementing the address and providing the incremented address as an input to one of the master latches.

7. A method as defined in claim 6 including continuously incrementing the address loaded into the second master latch during a burst mode of operation in response to subsequent leading edges of the clock pulses.

8. A method as defined in claim 7 including performing said selecting step by means of a multiplexer.

9. An apparatus for generating an address bit comprising:

(a) an external-address master latch;
(b) an internal-address master latch;
(c) an address selection circuit for selecting an external address stored in the external-address latch in response to an external-address control signal, and for selecting an internal address stored in the internal-address latch in response to an internal-address control signal;

(d) a slave latch for storing the selecting address from the address selection circuit and for providing the selected address to an output;

(e) feedback circuitry for providing a fed back version of the output signal;

(f) address incrementing circuitry, including a carry input from a previous stage, for incrementing the fed back selected address and providing an incremented address as an input to the internal-address master latch; and (g) a system clock signal for synchronizing the operation of the master and slave latches.

10. Apparatus as defined in claim 5 in which the circuit for selecting the respective address signals stored in the master latches is comprised of a pair of switches.

11. Apparatus as defined in claim 9 including a circuit for enabling the circuit for selection of respective address signals stored in the master latches at a time equal to or earlier than a time of actual transfer of signals stored in the master latches to the circuit for selecting the respective address signals.

12. Apparatus as defined in claim 10, and further including a slave latch coupling the pair of switches to the output, and a circuit for delaying enabling of the slave latch to a time equal to or later than a time of enabling of the switches.

13. Apparatus as defined in claim 10, and further including a slave latch coupling the pair of switches to the output, and a circuit for delaying enabling of the slave latch to a time that a signal applied thereto is stable.

14. Apparatus as defined in claim 12 including a circuit for inhibiting operation of the transfer stage in the event that the enable signals are all of a predetermined logic value.

15. Apparatus as defined in claim 9 including a circuit for inhibiting operation of the transfer stage in the event that the enable signals are all of a predetermined logic value.

16. A counter cell circuit for generating an address signal at an output comprising:

(a) a pair of master latches each for storing an address signal, (b) a counter cell output for receiving at least one of said address signals, (c) an intermediate storage and transfer stage having an output coupled to said counter cell output, (d) a multiplexer having control inputs for receiving control signals, and having signal inputs coupled to outputs of corresponding master latches and having an output coupled to an input of the intermediate stage, (e) a circuit for applying an external address signal to one of the master latches, during an external address input mode of operation;

(f) a feedback loop for applying a signal appearing at the counter output to the other of the master latches, via incrementing circuitry, during an internal address burst mode of operation, and (g) a system clock for synchronizing the loading of the master latches and the storage and transfer stage, whereby the counter cell output is generated directly from the external address or internally by incrementing a previous output in response to the system clock.

17. A counter as defined in claim 2, in which the slave latch comprises:

(a) a pair of PMOS FETs having their source-drain circuits connected in series between a voltage source VDD and serially connected source-drain circuits of a pair of NMOS FETs which are connected between the PMOS FETs and ground, (b) a gate of a first of the PMOS FETs, which is connected to the voltage source VDD, being coupled to ground, (c) a gate of a first of the NMOS FETS, which is connected to ground, being coupled to the voltage source VDD, (d) an input to the latch being coupled to a junction of the other PMOS FET and the other NMOS FET, and to an input of an inverter, (e) an output of the inverter being coupled to gates of said other PMOS FET and of said other NMOS FET, the output of the inverter providing an output to the latch, and (f) gate lengths of the first PMOS FET and the first NMOS FET being substantially larger than gate lengths of said other PMOS and NMOS FETs.

18. Apparatus as defined in claim 13, in which the slave latch comprises:

(a) a pair of PMOS FETs having their source-drain circuits connected in series between a voltage source VDD and serially connected source-drain circuits of a pair of NMOS FETs which are connected between the PMOS FETs and ground, (b) a gate of a first of the PMOS FETs, which is connected to the voltage source VDD, being coupled to ground, (c) a gate of a first of the NMOS FETs, which is connected to ground, being coupled to the voltage source VDD, (d) an input to the latch being coupled to a junction of the other PMOS FET and the other NMOS FET, and to an input of an inverter, (e) an output of the inverter being coupled to gates of said other PMOS FET and of said other NMOS FET, the output of the inverter providing an output to the latch, and (f) gate lengths of the first PMOS FET and the first NMOS FET being substantially larger than gate lengths of said other PMOS and NMOS FETs.

* * * * *